(12) United States Patent
Zhang et al.

(10) Patent No.: US 8,288,723 B2
(45) Date of Patent: Oct. 16, 2012

(54) TRANSMISSION ELECTRON MICROSCOPE MICRO-GRID AND METHOD FOR MAKING THE SAME

(75) Inventors: Li-Na Zhang, Beijing (CN); Chen Feng, Beijing (CN); Liang Liu, Beijing (CN); Kai-Li Jiang, Beijing (CN); Qun-Qing Li, Beijing (CN); Shou-Shan Fan, Beijing (CN)

(73) Assignees: Beijing FUNATE Innovation Technology Co., Ltd., Beijing (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 258 days.

(21) Appl. No.: 12/005,741

(22) Filed: Dec. 28, 2007

(65) Prior Publication Data

US 2008/0237464 A1 Oct. 2, 2008

(30) Foreign Application Priority Data

Mar. 30, 2007 (CN) .......................... 2007 1 0073768

(51) Int. Cl.
*H01J 37/26* (2006.01)
(52) U.S. Cl. ........ 250/311; 250/306; 250/307; 250/310; 250/492.1; 250/492.3; 438/409; 438/960
(58) Field of Classification Search .................. 250/306, 250/307, 310, 311, 492.1, 492.3; 438/409, 438/960
See application file for complete search history.

(56) References Cited

U.S. PATENT DOCUMENTS

| | | | | |
|---|---|---|---|---|
| 5,698,175 A * | 12/1997 | Hiura et al. | ................ | 423/447.1 |
| 5,788,853 A * | 8/1998 | Zenhausern | ...................... | 216/2 |
| 5,958,358 A * | 9/1999 | Tenne et al. | ................ | 423/561.1 |
| 6,863,942 B2 * | 3/2005 | Ren et al. | ...................... | 428/36.9 |
| 7,077,939 B1 * | 7/2006 | Crooks et al. | ................. | 204/450 |
| 7,166,266 B2 * | 1/2007 | Nikolaev et al. | ............. | 423/461 |
| 7,355,216 B2 * | 4/2008 | Yang et al. | .................... | 257/200 |
| 7,569,850 B2 * | 8/2009 | Noy et al. | ........................ | 257/40 |
| 7,750,297 B1 * | 7/2010 | Chow et al. | .................. | 250/311 |
| 2003/0185741 A1 * | 10/2003 | Matyjaszewski et al. | | 423/445 R |
| 2004/0034177 A1 * | 2/2004 | Chen | .............................. | 525/416 |
| 2004/0053780 A1 * | 3/2004 | Jiang et al. | .................... | 502/182 |
| 2004/0144970 A1 * | 7/2004 | Wang et al. | ..................... | 257/17 |

(Continued)

FOREIGN PATENT DOCUMENTS

JP 2005249414 A * 9/2005

(Continued)

OTHER PUBLICATIONS

Zhang et al., "Metal coating on suspended carbon nanotubes and its implication to metal-tube interaction," Chemical physics letters 331 (2000), pp. 35-41.*

(Continued)

*Primary Examiner* — Michael Logie
(74) *Attorney, Agent, or Firm* — Altis Law Group, Inc.

(57) ABSTRACT

A transmission electron microscope (TEM) micro-grid includes a metallic grid and a carbon nanotube film structure covered thereon. A method for making a TEM micro-grid includes the steps of: (a) providing an array of carbon nanotubes, quite suitably, providing a super-aligned array of carbon nanotubes; (b) drawing a carbon nanotube film from the array of carbon nanotubes; (c) covering the carbon nanotube film on a metallic grid, and treating the carbon nanotube film and the metallic grid with an organic solvent.

14 Claims, 4 Drawing Sheets

U.S. PATENT DOCUMENTS

| | | | |
|---|---|---|---|
| 2005/0007002 A1* | 1/2005 | Golovchenko et al. | 313/311 |
| 2005/0208304 A1* | 9/2005 | Collier et al. | 428/403 |
| 2006/0169975 A1 | 8/2006 | Noy et al. | |
| 2006/0204428 A1* | 9/2006 | Noy et al. | 423/445 R |
| 2006/0275956 A1* | 12/2006 | Konesky | 438/128 |
| 2007/0128707 A1* | 6/2007 | Rorrer et al. | 435/168 |
| 2007/0137786 A1* | 6/2007 | Luzzi | 156/304.1 |
| 2007/0142559 A1* | 6/2007 | Wang et al. | 525/242 |
| 2008/0187648 A1* | 8/2008 | Hart et al. | 427/8 |
| 2008/0251274 A1* | 10/2008 | Lee et al. | 174/113 R |

FOREIGN PATENT DOCUMENTS

| | | |
|---|---|---|
| JP | 2006244742 A * | 9/2006 |

OTHER PUBLICATIONS

Zhang et al., "Formation of metal nanowires on suspended single-walled carbon nanotubes", Applied physics letters vol. 77, No. 19. Nov. 2000.*

Klie et al., Multi-walled carbon nanotubes on amorphous carbon films, Carbon 42 (2004), pp. 1953-1957.*

Xuesong et al., Bottom-Up Growth of Carbon Nanotube Multilayers: Unprecedented Grow, Nano Letters (2005), pp. 1997-2000.*

Zhu et al., Aligned Carbon Nanotube Stacks by Water-Assisted Selective Etching, Nano Letters, (2005), pp. 2641-2645.*

Zhu et al., The growth of carbon nanotube stacks in the kinetics-controlled regime, Science Direct, (2006) pp. 344-348.*

Zhang et al., "Strong, Transparent, Multifunctional, Carbon Nanotube Sheets", Science (2005).*

* cited by examiner

TRANSMISSION ELECTRON MICROSCOPE MICRO-GRID AND METHOD FOR MAKING THE SAME

BACKGROUND

1. Field of the Invention

The present invention relates to a transmission electron microscope (TEM) micro-grid and a method for making the same.

2. Discussion of Related Art

In a transmission electron microscope (TEM), a porous carbon supporting film (i.e., micro-grid) is used, as an important tool, to carry powder samples and to observe high-resolution transmission electron microscope (HRTEM) images. With the development of nano-technology, micro-grids are increasingly coming into widespread use in the field of electron microscopy. Recently, the micro-grids used in transmission electron microscopes are usually manufactured using a layer of organic porous membrane covered on a metal mesh net, such as copper mesh net, or nickel mesh net, and subsequently a layer of non-crystal carbon films are deposited thereon via evaporation.

However, in actual applications, the non-crystal carbon films influence the observation of the high-resolution transmission electron microscopy images significantly, particularly when the diameter of the observed particles is less than 5 nanometers.

What is needed, therefore, is a transmission electron microscope (TEM) micro-grid and method for making the same, and the TEM micro-grids are conducive to acquiring better high-resolution transmission electron microscopy images when the diameter of the observed particles is less than 5 nanometers.

SUMMARY

In one embodiment, a method for making a TEM micro-grid includes the steps of: (a) providing an array of carbon nanotubes; (b) drawing a carbon nanotube film from the array of carbon nanotubes; (c) covering at least one above-described carbon nanotube film on a metallic grid and treating the at least one carbon nanotube film with an organic solvent.

Other advantages and novel features of the present TEM micro-grid will become more apparent from the following detailed description of preferred embodiments when taken in conjunction with the accompanying drawings.

BRIEF DESCRIPTION OF THE DRAWINGS

Many aspects of the present TEM micro-grid can be better understood with reference to the following drawings. The components in the drawings are not necessarily to scale, the emphasis instead being placed upon clearly illustrating the principles of the present TEM micro-grid.

Figure 1:
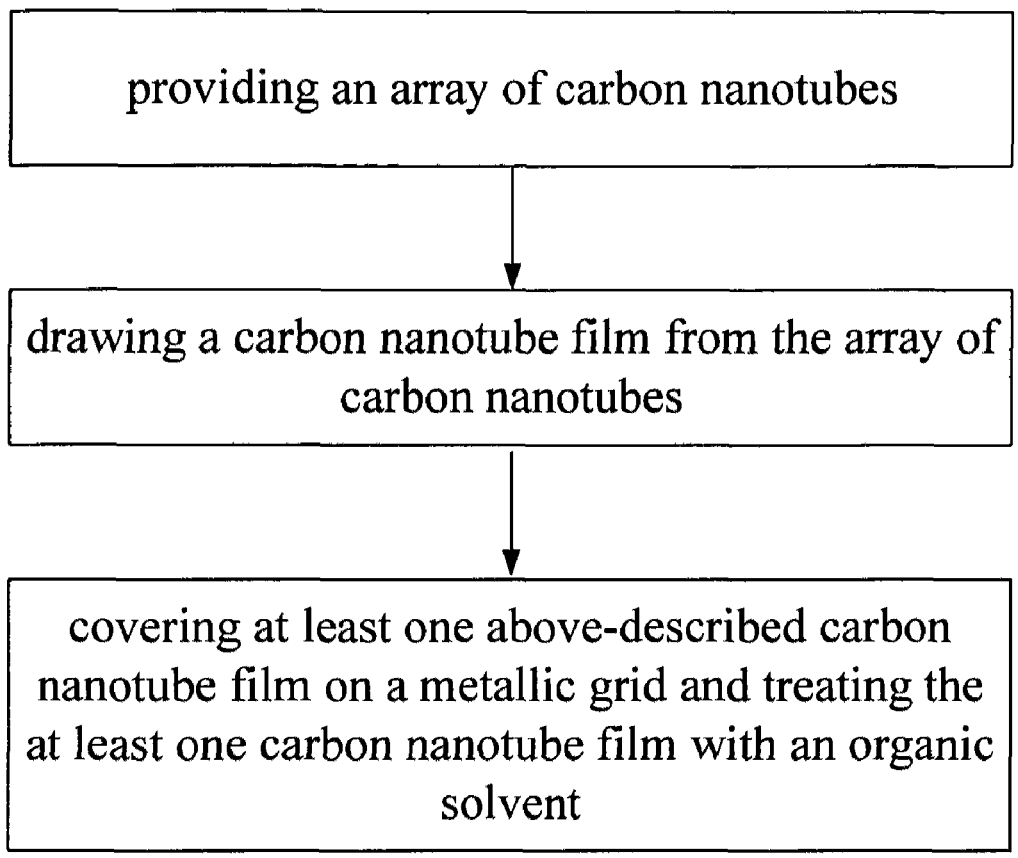
FIG. 1 is a flow chart of a method for making a TEM micro-grid, in accordance with a present embodiment.

Corresponding reference characters indicate corresponding parts throughout the several views. The exemplifications set out herein illustrate at least one preferred embodiment of the present TEM micro-grid, in at least one form, and such exemplifications are not to be construed as limiting the scope of the invention in any manner.

DETAILED DESCRIPTION OF PREFERRED EMBODIMENTS

Reference will now be made to the drawings to describe, in detail, embodiments of the present TEM micro-grid and method for making the same.

Referring to FIG. 1, a method for making a TEM micro-grid includes the steps of: (a) providing an array of carbon nanotubes, quite suitably, providing a super-aligned array of carbon nanotubes; (b) drawing a carbon nanotube film from the array of carbon nanotubes; (c) covering at least one above-described carbon nanotube film on a metallic grid, and treating the at least one carbon nanotube film with an organic solvent.

In step (a), a given super-aligned array of carbon nanotubes can be formed by the steps of: (a1) providing a substantially flat and smooth substrate; (a2) forming a catalyst layer on the substrate; (a3) annealing the substrate with the catalyst layer thereon in air at a temperature in an approximate range from 700° C. to 900° C. for about 30 to 90 minutes; (a4) heating the substrate with the catalyst layer thereon at a temperature in an approximate range from 500° C. to 740° C. in a furnace with a protective gas therein; and (a5) supplying a carbon source gas to the furnace for about 5 to 30 minutes and growing a super-aligned array of carbon nanotubes on the substrate.

In step (a1), the substrate can be a P-type silicon wafer, an N-type silicon wafer, or a silicon wafer with a film of silicon dioxide thereon. Preferably, a 4 inch P-type silicon wafer is used as the substrate. In step (a2), the catalyst can, advantageously, be made of iron (Fe), cobalt (Co), nickel (Ni), or any alloy thereof.

In step (a4), the protective gas can, beneficially, be made up of at least one of nitrogen ($N_2$), ammonia ($NH_3$), and a noble gas. In step (a5), the carbon source gas can be a hydrocarbon gas, such as ethylene ($C_2H_4$), methane ($CH_4$), acetylene ($C_2H_2$), ethane ($C_2H_6$), or any combination thereof.

The super-aligned array of carbon nanotubes can, opportunely, have a height of about 200 to 400 microns and includes a plurality of carbon nanotubes parallel to each other and approximately perpendicular to the substrate. The super-aligned array of carbon nanotubes formed under the above conditions is essentially free of impurities, such as carbonaceous or residual catalyst particles. The carbon nanotubes in the super-aligned array are closely packed together by the van der Waals attractive force.

Step (b) further includes the substeps of: (b1) selecting a plurality of carbon nanotube segments having a predetermined width from the array of carbon nanotubes; (b2) pulling the carbon nanotube segments at an even/uniform speed to form the carbon nanotube film.

In step (b1), quite usefully, the carbon nanotube segments, having a predetermined width, can be selected by using an adhesive tape as a tool to contact the super-aligned array. In step (b2), the pulling direction is, usefully, substantially perpendicular to the growing direction of the super-aligned array of carbon nanotubes.

More specifically, during the pulling process, as the initial carbon nanotube segments are drawn out, other carbon nanotube segments are also drawn out end to end, due to the van der Waals attractive force between the ends of adjacent segments. The carbon nanotube film produced in such manner can be selectively formed having a predetermined width. The carbon nanotube film includes a plurality of carbon nanotube segments. The carbon nanotubes in the carbon nanotube film are mainly parallel to the pulling direction of the carbon nanotube film.

A width of the carbon nanotube film depends on a size of the carbon nanotube array. A length of the carbon nanotube film can be arbitrarily set as desired. In one useful embodiment, when the substrate is a 4 inch type wafer as in the present embodiment, a width of the carbon nanotube film is in an approximate range from 1 centimeter to 10 centimeters.

It is noted that because the carbon nanotubes in the super-aligned carbon nanotube array have a high purity and a high specific surface area, the carbon nanotube film is adhesive. As such, the carbon nanotube film can adhered to the surface of the substrate directly and a plurality of carbon nanotube films can adhered to a surface one after another to form a multi-layer carbon nanotube film structure. The number of the layers is arbitrary and depends on the actual needs/use. The adjacent layers of the carbon nanotube film are combined by van de Waals attractive force to form a stable multi-layer film.

Quite usefully, the carbon nanotube film can be treated with an organic solvent. The organic solvent is volatilizable and can be selected from the group consisting of ethanol, methanol, acetone, dichloroethane, chloroform, and combinations thereof. Quite suitably, the organic solvent is ethanol in the present embodiment. The carbon nanotube film structure can, beneficially, be treated by either of two methods: dropping the organic solvent from a dropper to soak the entire surface of side carbon nanotube film structure or immerging a frame with the carbon nanotube film structure thereon into a container having an organic solvent therein. After being soaked by the organic solvent, the carbon nanotube segments in the carbon nanotube film will at least partially compact/shrink into carbon nanotube bundles due to the surface tension created by the organic solvent. Due to the decrease of the surface via bundling, the coefficient of friction of the carbon nanotube film is reduced, but the carbon nanotube film maintains high mechanical strength and toughness. Further, due to the shrinking/compacting of the carbon nanotube segments into the carbon nanotube bundles, the parallel carbon nanotube bundles are, relatively, distant (especially compared to the initial layout of the carbon nanotube segments) to each other in one layer and cross with the parallel carbon nanotube bundles in each adjacent layer. As such, a carbon nanotube film having a microporous structure can thus be formed (i.e., the micropores are defined by the spacing/gaps between adjacent bundles). The resulting spacing can, beneficially, be about in a range of 100-500 mesh.

It is to be understood that the microporous structure is related to the number of the layers of the carbon nanotube film structure. The greater the number of layers that are formed in the carbon nanotube film structure, the greater the number of bundles in the carbon nanotube film structure will be. Accordingly, the spacing/gaps between adjacent bundles and the diameter of the micropores will decrease. Further, a carbon nanotube film structure of arbitrarily chosen width and length can be formed by piling a plurality of carbon nanotube films and partially overlapped with each other. The width and length of the carbon nanotube film structure are not confined by the width and the length of the carbon nanotube film pulled from the array of carbon nanotubes.

Step (c) can be executed as follows: (c1) treating at least one carbon nanotube film achieved by step (b) with an organic solvent; and (c2) covering the at least one carbon nanotube film on a metallic grid. In step (c), the material of the metal grid is copper or other metal material. The organic solvent is volatilizable and can be selected from the group consisting of ethanol, methanol, acetone, dichloroethane, chloroform, and combinations thereof. The organic solvent can be dropped from a dropper, directly, to soak the entire surface of side carbon nanotube film structure to make a compact structure between the carbon nanotube film structure and the metal grid. After step (c), a step of removing extra portions of the carbon nanotube film on edges of the metallic grid is further provided.

It can be understood that the TEM micro-grid can be made by a carbon nanotube film drawn from an array of carbon nanotubes covered, directly, on a metal grid and a plurality of the carbon nanotube films can be adhered on the metal grid with carbon nanotube films thereon in sequence and parallel to each other. And then, an organic solvent is used to treat the carbon nanotube films to acquire a TEM micro-grid structure.

Figure 2:
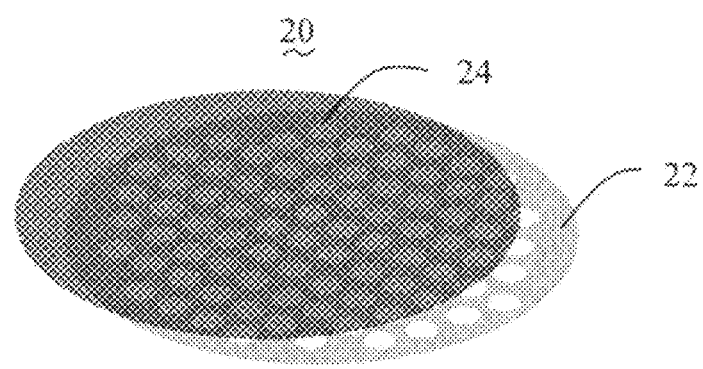
FIG. 2 is a structural schematic of a TEM micro-grid.
Figure 3:
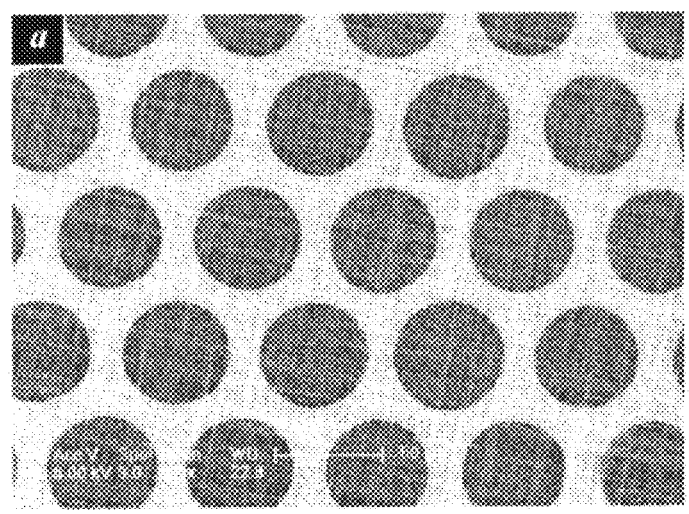
FIG. 3 shows a Scanning Electron Microscope (SEM) image of a TEM micro-grid, in accordance with a present embodiment.

Referring to FIG. 2 and FIG. 3, a TEM micro-grid 20 adopting a carbon nanotube film structure 24, formed by the method described above, is shown. The TEM micro-grid 20 includes a metallic grid 22 and a carbon nanotube film structure 24 covered thereon. The carbon nanotube film structure 24 includes at least one layer of carbon nanotube film. Beneficially, the carbon nanotube film structure 24 is formed by a plurality of carbon nanotube films overlapped or stacked with each other. The number of the layers and the angle between the aligned directions of two adjacent layers may be arbitrarily set as desired. A diameter of the microporous structure relates to the layers of the carbon nanotube film and is in an approximate range from 1 nanometer to 10 micrometers.

Figure 4:
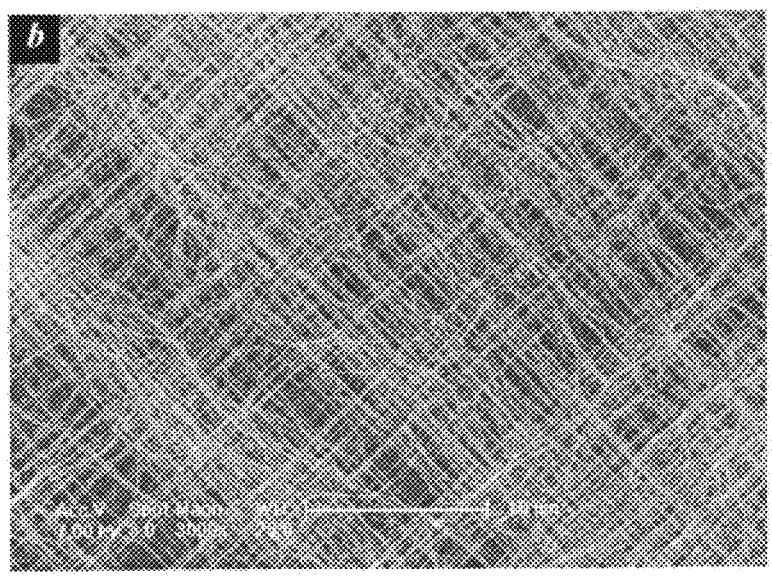
FIG. 4 shows a Scanning Electron Microscope (SEM) image of a carbon nanotube film of the TEM micro-grid, in accordance with a present embodiment.

Referring to FIG. 4, a Scanning Electron Microscope (SEM) image of the TEM micro-grid adopting multi-layer carbon nanotube films is shown. The angle between the aligned directions of the stacked multi-layer carbon nanotube film is 90°. The adjacent layers of the carbon nanotube film are combined by van de Waals attractive force to form a stable multi-layer film. The carbon nanotubes in the carbon nanotube film are aligned. The carbon nanotube film includes a plurality of carbon nanotube bundles in a preferred orientation. Bundles in two adjacent layers are crossed with each other to form a microporous structure. A diameter of the micropores is in an approximate range from 1 nanometer to 10 micrometers.

Figure 5:
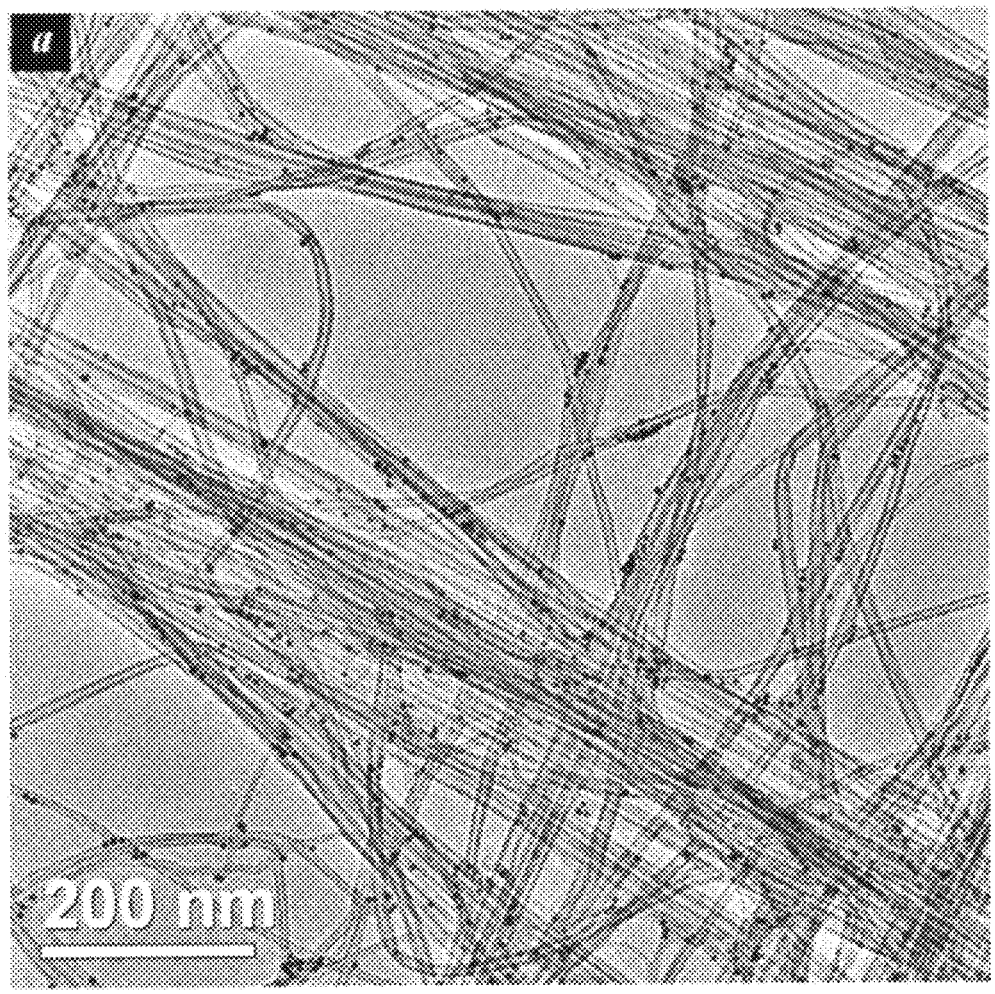
FIG. 5 shows a Transmission Electron Microscope (TEM) image of gold nano-particles observed by a TEM adopting a TEM micro-grid in accordance with the present embodiment.
Figure 6:
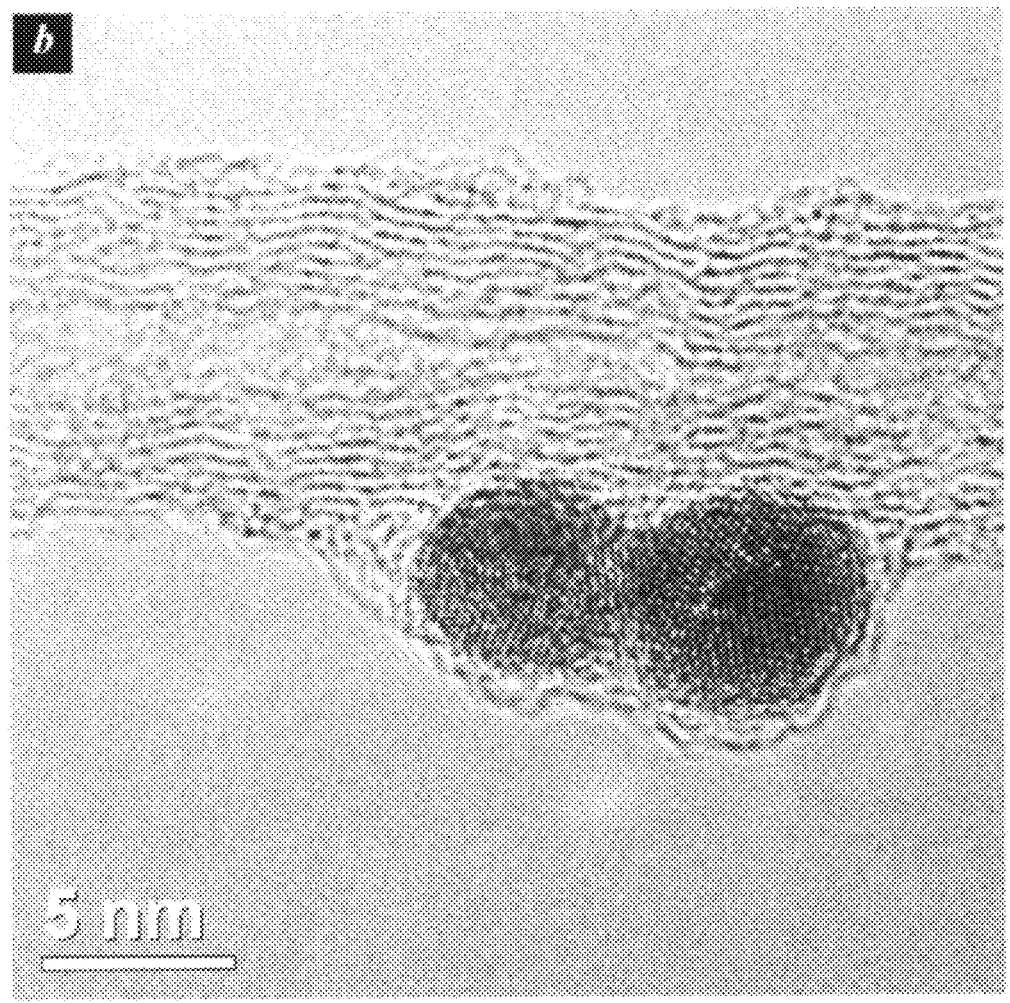
FIG. 6 is similar to FIG. 5 but greatly magnified.

The small sizes of the micropores in the microporous structure of the present embodiment can be used to support nano-materials, such as nano-particles, nano-wires, nano-rods, for the observation thereof via TEM. When the size of the nano-particles is less than 5 nanometers, the effect of the micropores is not obvious, but the adsorption effect of carbon nanotubes plays a main role. Those nano-particles with small size can be adsorbed stably on the walls of the carbon nanotubes and can be observed. Referring to FIG. 5 and FIG. 6, the black particles are gold nano-particles to be observed. The gold nano-particles are adsorbed stably on the walls of the carbon nanotubes and that is conducive to the observation of high-resolution image of gold nano-particles.

In addition, since the carbon nanotubes in the carbon nanotube array are of high-purity, uniform size, and have less defects, the TEM micro-grid of the present embodiment interference to the morphology and structure of the samples to be observed and the high-resolution image of the nano-particles adsorbed on the carbon nanotubes is minimized.

Compared to the conventional TEM micro-grid and method for making the same, the TEM micro-grid in the present embodiment can be formed by a carbon nanotube film drawn from an array of carbon nanotubes covered, directly, on a metal grid and the method is simple, fast and conductive to large-scale production. The TEM micro-grid made by the present method has a stable property. What's more, the absorption property of the carbon nanotubes is conducive to observation of high-resolution TEM image of nano-particles with a size of less than 5 nanometers.

Finally, it is to be understood that the above-described embodiments are intended to illustrate rather than limit the invention. Variations may be made to the embodiments without departing from the spirit of the invention as claimed. The above-described embodiments illustrate the scope of the invention but do not restrict the scope of the invention

What is claimed is:

1. A transmission electron microscope (TEM) micro-grid, comprising:
    a metallic grid comprising a contact surface; and
    a carbon nanotube film structure located on and in contact with the contact surface, wherein the carbon nanotube film structure comprises at least two carbon nanotube films stacked on each other, the at least two carbon nanotube films are combined only by van der Waals attractive force therebetween, and each carbon nanotube film consists of a plurality of carbon nanotubes substantially parallel to the contact surface.

2. The TEM micro-grid as claimed in claim 1, wherein each carbon nanotube film is a film structure formed by a plurality of successive carbon nanotube bundles, and the carbon nanotube bundles are in a preferred orientation.

3. The TEM micro-grid as claimed in claim 1, wherein the carbon nanotube film structure comprises a plurality of micropores.

4. The TEM micro-grid as claimed in claim 3, wherein a diameter of the micropores is in a range from about 1 nanometer to about 10 micrometers.

5. The TEM micro-grid as claimed in claim 1, wherein an angle between aligned directions of the plurality of carbon nanotubes in the adjacent carbon nanotube films is about 90 degrees.

6. The TEM micro-grid as claimed in claim 1, wherein each carbon nanotube film comprises a plurality of successive carbon nanotube bundles joined end to end.

7. The TEM micro-grid as claimed in claim 1, wherein the plurality of carbon nanotubes are substantially parallel to a common direction.

8. The TEM micro-grid as claimed in claim 1, wherein the plurality of carbon nanotubes are substantially parallel to a surface of the corresponding carbon nanotube film.

9. The TEM micro-grid as claimed in claim 1, wherein the carbon nanotube film structure is adhered to the metallic grid.

10. The TEM micro-grid as claimed in claim 1, wherein the carbon nanotube film structure is an adsorbing element capable of adsorbing an observed sample.

11. The TEM micro-grid as claimed in claim 1, wherein each carbon nanotube film comprises a plurality of carbon nanotube bundles substantially parallel to each other.

12. The TEM micro-grid as claimed in claim 1, wherein the metallic grid has an interface between the at least two carbon nanotube films that is substantially parallel to the contact surface.

13. A transmission electron microscope (TEM) micro-grid, comprising:
    a metallic grid comprising a contact surface; and
    a carbon nanotube film structure located on and in contact with the contact surface, the carbon nanotube film structure comprises at least two carbon nanotube films stacked on each other, wherein the at least two carbon nanotube films are combined; each carbon nanotube film consists of a plurality of carbon nanotubes; the at least two carbon nanotube films are substantially parallel to the contact surface of the metallic grid, and an angle between aligned directions of the plurality of carbon nanotubes in each of the adjacent carbon nanotube films is about 90 degrees; wherein the plurality of carbon nanotubes extend substantially parallel to the contact surface.

14. A transmission electron microscope (TEM) micro-grid capable of supporting a sample, comprising:
    a metallic grid; and
    a sample support located on and in contact with the metallic grid,
    wherein the sample support comprises a carbon nanotube film structure, the carbon nanotube film structure comprises at least two carbon nanotube films stacked on each other that are combined by van der Waals attractive force therebetween, each of the at least two carbon nanotube films consists of a plurality of carbon nanotubes, the plurality of carbon nanotubes of one of the at least two carbon nanotube films are substantially aligned along a first direction, the plurality of carbon nanotubes of another of the at least two carbon nanotube films is substantially aligned along a second direction, and the first direction intersects the second direction.

* * * * *